United States Patent
Schiml et al.

(10) Patent No.: US 7,776,726 B2
(45) Date of Patent: Aug. 17, 2010

(54) SEMICONDUCTOR DEVICES AND METHODS OF MANUFACTURE THEREOF

(75) Inventors: Thomas Schiml, Poughkeepsie, NY (US); Manfred Eller, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 212 days.

(21) Appl. No.: 11/417,383

(22) Filed: May 4, 2006

(65) Prior Publication Data

US 2007/0257327 A1   Nov. 8, 2007

(51) Int. Cl.
*H01L 21/04* (2006.01)
*H01L 21/425* (2006.01)

(52) U.S. Cl. ......... 438/510; 438/514; 438/527; 438/529; 257/E29.059

(58) Field of Classification Search .......... 438/555, 438/549; 257/E21.059
See application file for complete search history.

(56) References Cited

U.S. PATENT DOCUMENTS

| | | | |
|---|---|---|---|
| 5,344,787 A | 9/1994 | Nagalingam et al. | |
| 5,543,337 A | 8/1996 | Yeh et al. | |
| 5,874,329 A * | 2/1999 | Neary et al. | 438/203 |
| 5,920,776 A * | 7/1999 | Fratin et al. | 438/257 |
| 6,010,952 A | 1/2000 | Tsai et al. | |
| 6,064,595 A * | 5/2000 | Logie et al. | 365/185.18 |
| 6,767,831 B1 * | 7/2004 | Chu et al. | 438/682 |
| 7,011,998 B1 * | 3/2006 | Ju et al. | 438/197 |
| 2006/0073685 A1 * | 4/2006 | Ghneim et al. | 438/519 |
| 2006/0194421 A1 * | 8/2006 | Ieong et al. | 438/510 |
| 2006/0208204 A1 * | 9/2006 | Gupta et al. | 250/492.21 |
| 2007/0148926 A1 * | 6/2007 | Datta et al. | 438/510 |

* cited by examiner

*Primary Examiner*—Charles D Garber
*Assistant Examiner*—Angel Roman
(74) *Attorney, Agent, or Firm*—Slater & Matsil, L.L.P (57) ABSTRACT

Semiconductor devices and methods of manufacture thereof are disclosed. A preferred embodiment includes providing a workpiece having a first orientation and at least one second orientation. The semiconductor device is implanted with a dopant species using a first implantation process in the first orientation of the workpiece. The semiconductor device is implanted with the dopant species using a second implantation process in the at least one second orientation of the workpiece, wherein the second implantation process is different than the first implantation process.

31 Claims, 4 Drawing Sheets

SEMICONDUCTOR DEVICES AND METHODS OF MANUFACTURE THEREOF

TECHNICAL FIELD

The present invention relates generally to the fabrication of semiconductor devices, and more particularly to the formation of electronic components of semiconductor devices.

BACKGROUND

Generally, semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (ICs). There may be a plurality of transistors, memory devices, switches, conductive lines, diodes, capacitors, logic circuits, and other electronic components formed on a single die or chip, for example.

Optical photolithography involves projecting or transmitting light through a pattern comprised of optically opaque or translucent areas and optically clear or transparent areas on a mask or reticle. For many years in the semiconductor industry, optical lithography techniques such as contact printing, proximity printing, and projection printing have been used to pattern material layers of integrated circuits. Lens projection systems and transmission lithography masks are used for patterning, wherein light is passed through the lithography mask to impinge upon a photosensitive material layer disposed on semiconductor wafer or workpiece. After development, the photosensitive material layer is then used as a mask to pattern an underlying material layer. The patterned material layers comprise electronic components of the semiconductor device.

There is a trend in the semiconductor industry towards scaling down the size of integrated circuits, to meet the demands of increased performance and smaller device size. As features of semiconductor devices become smaller, it becomes more difficult to pattern the various material layers because of diffraction and other effects that occur during the lithography process. In particular, lithography techniques used to pattern the various material layers become challenging as device features shrink.

Lithography techniques such as immersion lithography and EUV lithography, as examples, are under development to address the lithography challenges of decreased feature sizes. However, line shortening of critical dimensions still poses a problem for smaller features, often only in one direction of a wafer.

Thus, what are needed in the art are improved methods for forming electronic components of semiconductor devices.

SUMMARY OF THE INVENTION

These and other problems are generally solved or circumvented, and technical advantages are generally achieved, by preferred embodiments of the present invention, which provide novel methods of fabricating semiconductor devices and structures thereof.

In accordance with a preferred embodiment of the present invention, a method of fabricating a semiconductor device includes providing a workpiece having a first orientation and at least one second orientation. The semiconductor device is implanted with a dopant species using a first implantation process in the first orientation of the workpiece. The semiconductor device is implanted with the dopant species using a second implantation process in the at least one second orientation of the workpiece, wherein the second implantation process is different than the first implantation process.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that embodiments of the present invention provide many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely implemented in manufacturing processes used to fabricate semiconductor devices. Embodiments of the invention may also be applied, however, to other applications where material layers are patterned using lithography or a direct patterning method, and implanted with dopant species or other impurities, for example.

As feature sizes of semiconductor devices continue to shrink, it becomes exceedingly difficult to image a set of different features and feature sizes on a material layer. It is usually desirable for all devices of the same type which are designed with the same dimensions to exhibit the same electrical performance across a surface of a wafer. However, it is often difficult to form vertical and horizontal lines having the same lengths and widths, for example, which causes differences in electrical performance of devices.

The terms "horizontal" and "vertical" are referred to herein regarding the orientation of features formed on a planar surface of a workpiece or wafer, wherein the term "horizontal" refers to a first direction on the planar surface of the wafer, and wherein the term "vertical" refers to a direction on the planar surface of the wafer substantially perpendicular to the horizontal direction. In some embodiments, for example, the term "horizontal" direction on a wafer is defined with respect to movement of a lithography mask and wafer stage during a scanning process, e.g., a direction on the planar surface of the wafer parallel to the direction of the scanning, and wherein the term "vertical" refers to a direction on the planar surface of the wafer that is substantially perpendicular to the scanning direction.

Figure 1:
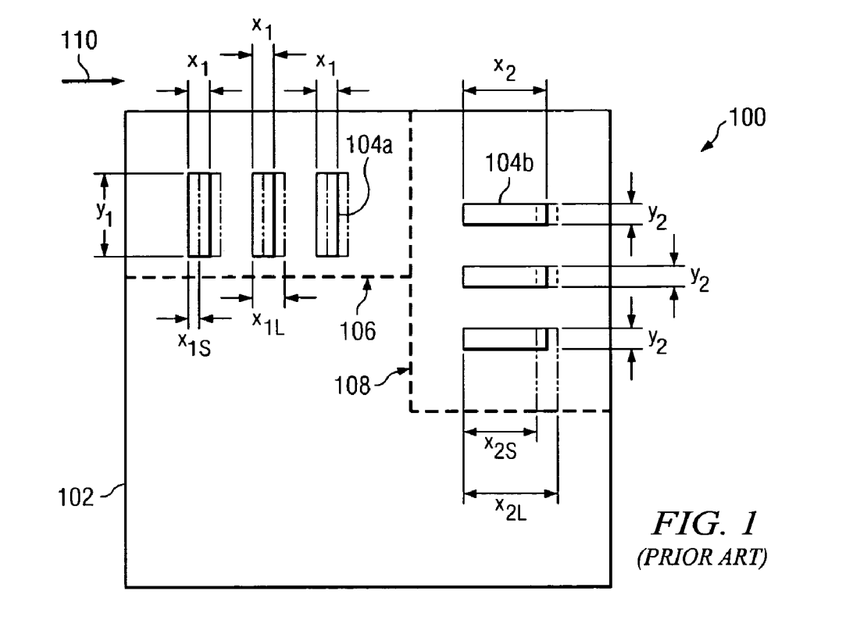
FIG. 1 illustrates a top view of a prior art integrated circuit die, wherein horizontally oriented features comprise different dimensions than vertically oriented features.

In many semiconductor designs, such as CMOS transistors, devices are laid out or positioned in two substantially orthogonal directions, e.g., on an x axis and a y axis. FIG. 1 illustrates a top view of a prior art integrated circuit die 102, wherein horizontally oriented features 104b in region 108 comprise a different dimension than vertically oriented features 104a in region 106. The features 104a and 104b may comprise gates of transistors, for example, or other features of a semiconductor device.

In many applications, it is desirable for the features 104b to comprise a length $x_2$ in a horizontal direction of the workpiece (e.g., workpiece or wafer 111 shown in FIG. 2) the die 102 is formed in that is substantially equal to the length $y_1$ of features 104a in a vertical direction of the workpiece. It is also desirable for the features 104b to comprise a width $y_2$ in a vertical direction of the workpiece the die 102 is formed in that is substantially equal to the width $x_1$ of features 104a in the vertical direction of the workpiece.

For example, if features 104b comprise the same dimension as the dimensions of features 104a, then devices formed from the features 104a and 104b will comprise the same operating parameters and electrical characteristics. If the features 104a and 104b comprise transistor gates, for example, the widths $y_2$ and $x_1$ of the gates largely impact the operating parameters of the transistors, e.g., the current and voltage. The widths $y_2$ and $x_1$ of transistor gates are often referred to in the art as "gate lengths," for example.

However, due to imperfections in lithography processes, etching processes, and other manufacturing processes, features 104b in a horizontal orientation may comprise different dimensions than features 104a in a vertical orientation, as shown in phantom in FIG. 1. The features 104a and 104b may be formed by depositing a layer of photosensitive material over a workpiece, and exposing the layer of photosensitive material using a lithography mask, e.g., in a horizontal scanning direction 110. The layer of photosensitive material is then developed and used as a mask to pattern a material layer of the workpiece, forming the features 104a and 104b.

Due to imperfections in various manufacturing processes, because features 104a are oriented vertically and features 104b are oriented horizontally, their dimensions may be different. For example, if a shortening effect occurs in the horizontal scanning direction 110, then features 104a may comprise a width $x_{1S}$ that is less than width $y_2$ of features 104b, and features 104a may comprise a length $y_1$ that is greater than length $x_{2S}$ of features 104b, as shown. Likewise, if a lengthening effect occurs in the horizontal scanning direction 110, then features 104a may comprise a width $x_{1L}$ that is greater than width $y_2$ of features 104b, and features 104a may comprise a length $y_1$ that is less than length $x_{2L}$ of features 104b, also shown.

Features 104a and 104b comprising different dimensions is disadvantageous because devices formed from the features 104a and 104b will have non-uniform performance and operating characteristics. Non-uniform features 104a and 104b across a surface of a die 102 or wafer result in decreased and unpredictable device performance, decreased yields, and increased overall manufacturing costs, for example.

In some applications, where the features 104a and 104b comprise gates of transistors, for example, in order to reduce variation of the critical dimensions of the gates 104a and 104b, e.g., in sub-100 nm technologies, the gates 104a and 104b are laid out or positioned only in one direction, e.g., on the x axis or horizontal direction only. The x-y variance or delta tends to present a systematic effect that increases overall line-width variations, for example. By forming gates 104a and 104b in only one direction of the workpiece, variational aspects caused by the manufacture of the mask, which may cause an x-y offset, and variational aspects caused by lithography processes, which may cause an x-y offset due to scan and lens performances, may be reduced.

However, in some applications, it is beneficial from a density perspective to allow devices to be positioned in both the x and y direction (e.g., in both the horizontal and vertical direction) on a single die or chip, in order to improve packing density.

Thus, what are needed in the art are methods of forming semiconductor devices wherein features of devices may be oriented in both the horizontal and vertical direction, yet comprise the same operating characteristics, regardless of the orientation of the features.

Another need in the art is the ability to form more than one type of device on a material layer without increasing the number of lithography masks required to manufacture a semiconductor device.

Embodiments of the present invention achieve technical advantages by providing novel methods of forming features in both a horizontal and vertical direction. In CMOS applications, a reduction of negative effects of gate line-width variation may be achieved, while still maintaining the device layout in both an x and y direction.

In one embodiment, variations in performance of orthogonally-positioned devices are reduced using novel implantation processes to compensate for dimensional variations in the horizontal and vertical directions. In another embodiment, fabrication of devices having different operating parameters and electrical characteristics without requiring additional lithography masks is achieved by the novel implantation processes.

Figure 2:
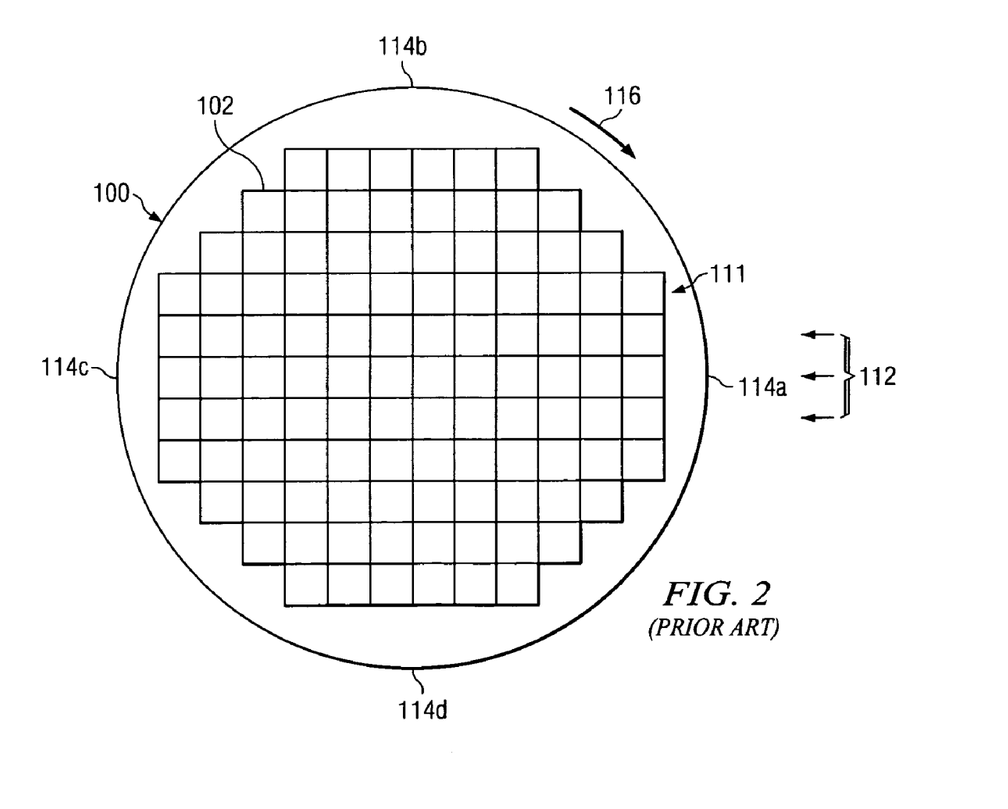
FIG. 2 shows a top view of a semiconductor wafer comprising a plurality of die, illustrating a prior art method of implanting a dopant species using the same dopant implantation process at four rotational positions of the wafer.

First, a prior art implantation process for a semiconductor device 100 will be described, with reference to FIG. 2, which shows a top view of a semiconductor wafer 111 or workpiece comprising a plurality of die 102, illustrating a method of implanting a dopant species into features of the die 102 using the same dopant implantation process 112 at four rotational positions 114a, 114b, 114c, and 114d of the wafer 111. Such an implantation process 112 is often used to form source and drain regions of transistors, for example.

To implant the dopant species, first, the implantation process 112 is performed, typically at an angle with respect to the wafer 111 horizontal surface, at a rotational position 114a as shown. Then the wafer 111, which is typically mounted on a wafer stage (not shown), is rotated by 90 degrees, shown at 116, to a rotational position 114b. The implantation process 112 is performed again, and the wafer 111 is rotated by 90 degrees again to rotation position 114c. After another implantation process 112, the wafer 111 is rotated again and the implantation process 112 is repeated.

By performing the implantation process 112 at four rotational positions 114a, 114b, 114c, and 114d, exposed portions of the wafer 111 are implanted with the same amount of the dopant species in each of the four implantation directions, e.g., directed from the rotational positions 114a, 114b, 114b, and 114d, while avoiding vertical features in the topography of the surface of the wafer 111 from blocking or preventing portions of the wafer 11 from being implanted. The wafer 111 may later be heated or annealed to drive the dopant species further into the wafer 111 surface, for example. Furthermore, vertical features susceptible to implantation of the dopant species, such as features comprising polysilicon, are evenly implanted with the dopant species on all sides in this prior art implantation process 112.

Embodiments of the present invention achieve technical advantages by implanting a workpiece with a different implantation process at two or more different rotational positions. The uneven implantation of a dopant species may compensate for feature size variations, in one embodiment. In another embodiment, devices having features with substantially the same dimensions are formed that have different operating characteristics depending on their horizontal or vertical orientation using the different implantation processes at two or more rotational positions, to be described further herein.

Figure 3:
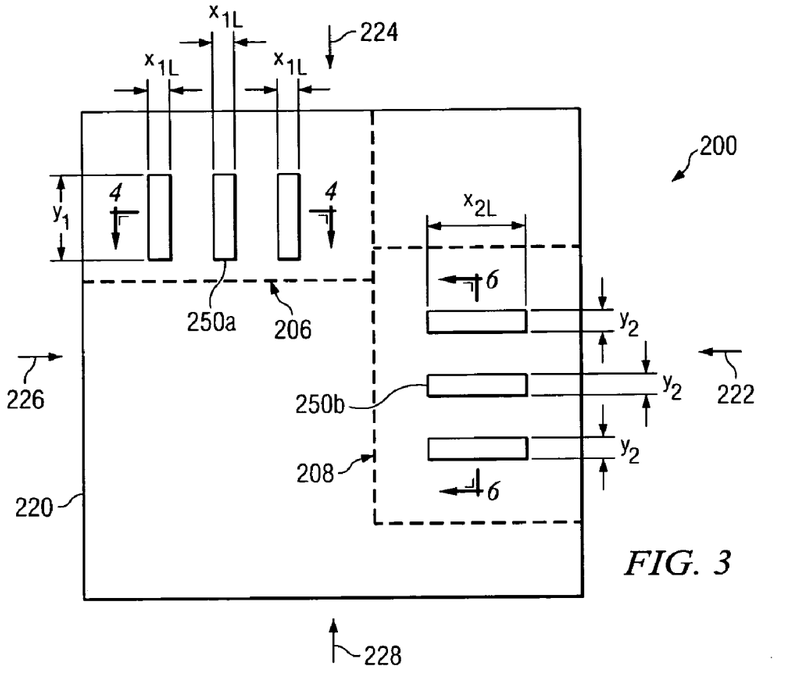
FIG. 3 illustrates a top view of an integrated circuit die in accordance with an embodiment of the present invention, wherein two or more different implantation processes are performed at four rotational positions of a wafer.

FIG. 3 illustrates a top view of an integrated circuit die 220 in accordance with an embodiment of the present invention, wherein two or more different implantation processes 222, 224, 226, and 228 are performed at four rotational positions of a wafer or workpiece 220. The semiconductor device 200 or circuit includes a workpiece 220. The workpiece 220 may include a semiconductor substrate comprising silicon or other semiconductor materials covered by an insulating layer, for example. The workpiece 220 may also include other active components or circuits, not shown. The workpiece 220 may comprise silicon oxide over single-crystal silicon, for example. The workpiece 220 may include other conductive layers or other semiconductor elements, e.g., transistors, diodes, etc. Compound semiconductors, GaAs, InP, Si/Ge, or SiC, as examples, may be used in place of silicon. The workpiece 220 may comprise a silicon-on-insulator (SOI) substrate, for example.

The workpiece 220 comprises a first orientation and at least one second orientation. In some embodiments, the first orientation and a second orientation may comprise a vertical direction and/or a horizontal direction, the horizontal direction being substantially perpendicular to the vertical direction. The vertical direction and the horizontal direction comprise directions on a planar surface of the workpiece 220, for example, that are substantially perpendicular to one another. The first orientation and the at least one second orientation may comprise other rotational positions along an edge of the workpiece 220, such as non-perpendicular directions, for example.

In accordance with a preferred embodiment of the present invention, a portion 206 of the semiconductor device 200 comprises a first concentration of a dopant species in a vertical direction, and a portion 208 of the semiconductor device 200 comprises a second concentration of the dopant species in a horizontal direction. There may be two or more portions 206 and two or more portions 208 formed in a single die or chip, for example, not shown. The second concentration of the dopant species is different than the first concentration of the dopant species. The first and second concentrations of the dopant species may be implanted into the workpiece 220, features 250a and 250b disposed over the workpiece 220, or both, for example.

In a preferred embodiment, a method of fabricating the semiconductor device 200 includes first, providing the workpiece 220. A material layer to be patterned is deposited over the workpiece 220. The material layer may comprise a conductive, insulative, or semiconductive material, or combinations thereof, as examples. In some embodiments, the material layer preferably comprises a semiconductive material such as silicon or polysilicon, for example, although other semiconductive materials may also be used. In an embodiment where transistors are formed, the material layer may comprise a gate dielectric material comprising an insulator and a gate material formed over the gate dielectric material, for example.

A layer of photosensitive material (not shown) is deposited over the material layer, and the layer of photosensitive material is patterned using lithography to form a latent pattern for the plurality of features to be formed in the material layer on the layer of photosensitive material. The layer of photosensitive material is developed, and then the layer of photosensitive material is used as a mask while the material layer is etched using an etch process, forming a plurality of features 250a and 250b in the first region 206 and the second region 208, respectively, as shown.

Again, in some embodiments, the features 250a and 250b preferably comprise gates of transistors. The material of the features 250a and 250b preferably comprises a conductive, semiconductive material, or combinations or multiple layers thereof, formed over a gate dielectric material, as examples, in this embodiment.

The features 250a in region 206 are preferably oriented in a substantially vertical orientation, e.g., the lengths $y_1$ of the features 250a run in a direction substantially parallel to the vertical direction of the workpiece 220 planar surface. The features 250b in region 208 are preferably oriented in a substantially horizontal orientation, e.g., the lengths $x_{2L}$ of the features 250b run in a direction substantially parallel to the horizontal direction of the workpiece 220 planar surface.

After the features 250a and 250b are formed, the semiconductor device 200 is implanted with a dopant species using a first implantation process 222 in a first orientation of the workpiece, e.g., in a substantially horizontal direction from the right of the workpiece 220, as shown in FIG. 3. Then, the semiconductor device 200 is implanted with the dopant species using a second implantation process 224 in at least one second orientation of the workpiece 220, such as from a vertical direction at the top of the workpiece 220. The second implantation process 224 is preferably different than the first implantation process 222.

Third and fourth implantation processes 226 and 228, respectively, may also be performed on the semiconductor device 200, as shown in FIG. 3, e.g., in a horizontal direction from the left, and in a vertical direction from the bottom. The third implantation process 226 may comprise the same implantation process as the first implantation process 222, in one embodiment. Alternatively, the third implantation process 226 may be different than the first implantation process 222 and/or the second implantation process 224. Likewise, the fourth implantation process 228 may comprise the same implantation process as the second implantation process 224, in one embodiment, although alternatively, the fourth implantation process 228 may be different than the first implantation process 222, the second implantation process 224 and/or the third implantation process 226, as examples.

In FIG. 3, an example is shown wherein patterned features 250*a* and 250*b* formed on the semiconductor device 200 formed in a first region 206 and a second region 208, respectively, have been lengthened in the lithography process in the horizontal direction. For example, features 250*a* in the first region 206 comprise a width $x_{1L}$, and features 250*b* in the second region 208 comprise a length $x_{2L}$. The length $x_{2L}$ of the features 250*b* in the second region 208 is greater than the length $y_1$ of features 250*a* in the first region 206. The width $x_{1L}$ of features 250*a* in the first region 206 is greater than the width $y_2$ of features 250*b* in the second region 208.

Figure 4:
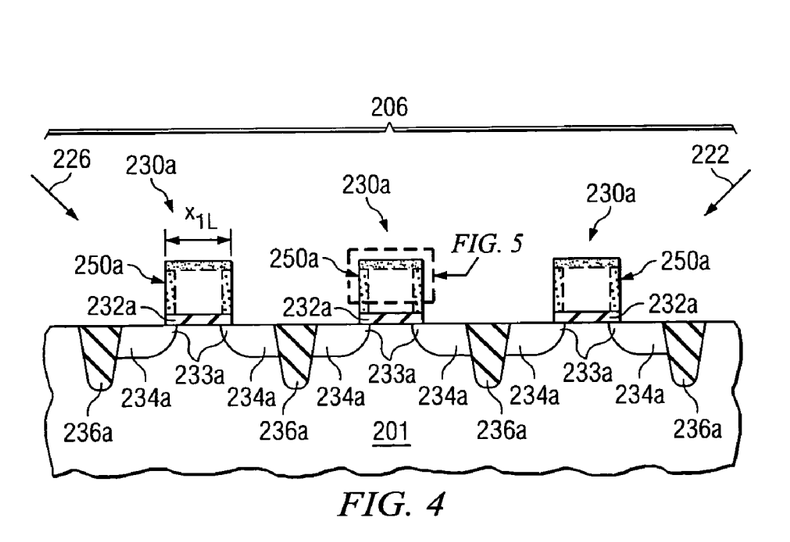
FIG. 4 shows a cross-sectional view of vertically oriented features in a first region of FIG. 3.
Figure 5:
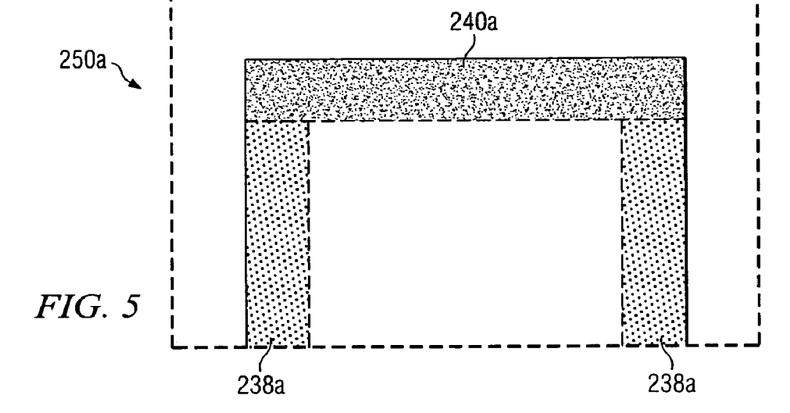
FIG. 5 shows a more detailed view of a vertically oriented feature shown in FIG. 4.

FIG. 4 shows a cross-sectional view of vertically oriented features 250*a* in a first region 206 of FIG. 3 in an embodiment wherein the features 250*a* comprise transistors 230*a*. The features 250*a* comprise a gate dielectric material 232*a* that comprises an insulator, and a gate material disposed over the gate dielectric material 232*a*. In this embodiment, the gate material comprises a semiconductive material such as silicon that is implanted with the dopant species of the implantation processes 224 and 228. FIG. 5 shows a more detailed view of the vertically oriented feature 250*a* shown in FIG. 4.

To fabricate the transistors 230*a*, shallow trench isolation (STI) regions 236*a* are formed in a workpiece 201 by patterning the workpiece 201 and back-filling the patterns in the workpiece 201 with an insulating material. The gate dielectric material 232*a* is formed over the workpiece 201, and the gate material is formed over the gate dielectric material 232*a*. The gate material and the gate dielectric material 232*a* are patterned using lithography to form the features 250*a*. The transistors 230*a* are shown in a cross-sectional view across the widths $x_{1L}$ in FIG. 4.

The implantation processes 222, 224, 226, and 228 are then performed on the semiconductor device 200. For example, the workpiece 201 is oriented in a first position, e.g. with the implantation source proximate the right of the workpiece 201, as shown, and the semiconductor device 200 is implanted with a dopant species using the first implantation process 222. The workpiece 201 is rotated about 90 degrees (not shown; rather, the directions of the implantation processes relative to a fixed workpiece 201 are shown in FIG. 3: see FIG. 2 at 116) to a second position, and then the semiconductor device 200 is implanted with the dopant species using the second implantation process 224. The workpiece 201 is rotated about 90 degrees to a third position, and then the semiconductor device 200 is implanted with the dopant species using a third implantation process 226. The workpiece 201 is rotated again by about 90 degrees to a fourth position, and then the semiconductor device is implanted with the dopant species using a fourth implantation process 228.

Because the implantation processes 222 and 226 are in the horizontal direction or orientation of the workpiece 201, these implantation processes 222 and 226 more predominantly affect the exposed portions of the workpiece 201 and the features 250*a*, for example.

Implanting the semiconductor device 200 may comprise implanting a top portion of exposed portions of the workpiece 201 and/or implanting the features 250*a*, for example. For example, the implantation processes 222, 224, 226, and 228 preferably result in the formation of source and drain regions 234*a* in a top surface of the workpiece 201, as shown in FIG. 4, in some embodiments.

The implantation processes 222, 224, 226, and 228 may result in the formation of source and drain regions 234*a* that extend beneath the features 250*a* or gates by a first amount 233*a*, as shown in FIG. 4. Alternatively, an anneal process may be used to cause the dopant species of the implantation processes 222, 224, 226, and 228 to migrate deeper into the workpiece 201, beneath a portion of the features 250*a*.

In some embodiments, the implantation processes 222, 224, 226, and 228 result in the implantation of sidewalls and the top surface of the gate material of the features 250*a*, as shown in a more detailed view in FIG. 5. For example, the sidewalls are more substantially implanted using the horizontal implantation processes 222 and 226 than the vertical implantation processes 224 and 228, resulting in a dopant concentration 238*a* of the dopant species along the sidewalls of the gate material. The top surfaces of the gate material are exposed to all four implantation processes 222, 224, 226, and 228, which results in a different dopant concentration 240*a* in the top surface of the gate material, e.g., and may comprise a greater dopant concentration 240*a* than the sidewall dopant concentration 238*a* in some embodiments.

Figure 6:
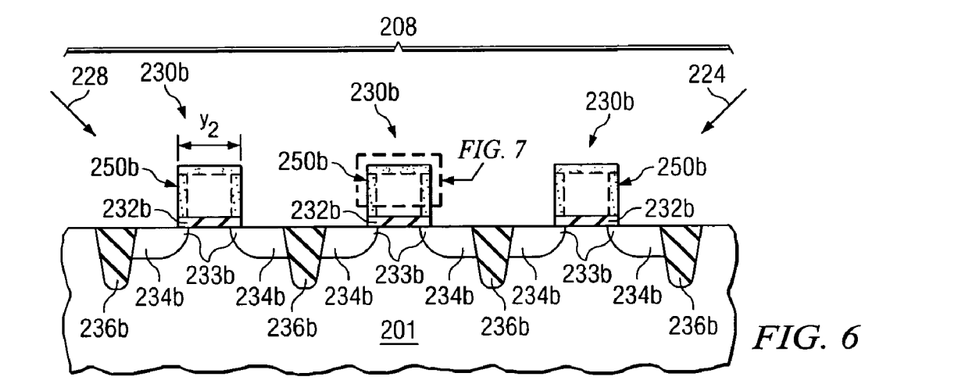
FIG. 6 shows a cross-sectional view of horizontally oriented features in a second region of FIG. 3.
Figure 7:
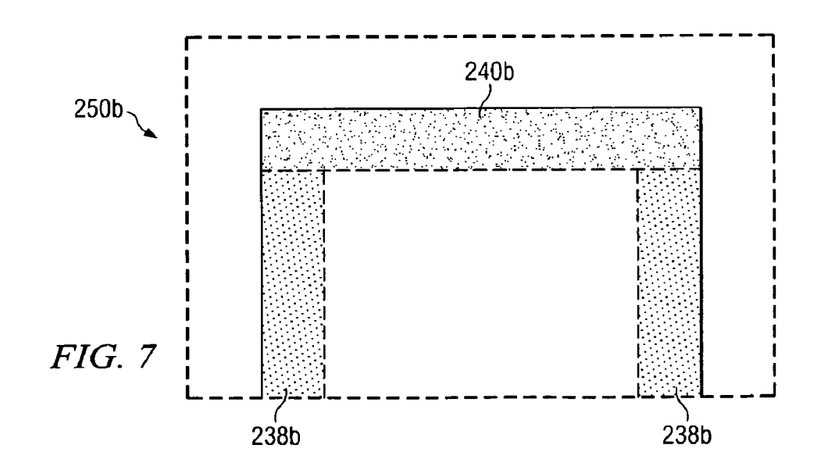
FIG. 7 shows a more detailed view of a horizontally oriented feature shown in FIG. 6.

FIG. 6 shows a cross-sectional view of horizontally oriented features 250*b* in a second region 208 of FIG. 3. The features 250*b* are preferably formed simultaneously with the formation of the features 250*a* in the first region 206, and thus, the manufacturing processes and materials for the various elements shown in FIG. 6 are similar to those described for the elements in FIG. 4, for example, wherein a "b" suffix is used for the elements in FIG. 6, and an "a" suffix is used for the elements in FIG. 4. FIG. 7 shows a more detailed view of the horizontally oriented feature shown in FIG. 6.

The sidewalls of the gate material of the features 250*b* are implanted using the vertical implantation processes 224 and 228 shown in FIG. 3, resulting in a dopant concentration 238*b* of the dopant species along the sidewalls of the gate material. The top surfaces of the gate material of features 250*b* are exposed to all four implantation processes 222, 224, 226, and 228, which results in a different dopant concentration 240*b* in the top surface of the gate material, e.g., and may comprise a greater dopant concentration 240*b* than the sidewall dopant concentration 238*b* in some embodiments.

The source and drain regions 234*b* extend beneath the second gates by a second amount 233*b*, as shown in FIG. 6, wherein the second amount 233*b* is substantially the same as, or different than, the first amount 233*a* shown in FIG. 4, as examples.

Sidewall spacers may be formed over the features 250*a*, and the fabrication process for the semiconductor device 200 is then continued. For example, insulating and encapsulating material layers may be disposed over the transistors 230a and 230b, and the insulating and encapsulating material layers may be patterned and filled with conductive materials to make electrical contact to the source and drain regions 234a, 234b, and gates of the features 250a and 250b of the transistors 230a and 230b, not shown (see FIGS. 10 and 11).

Note that in some embodiments, a material such as a conductor or insulator may be deposited or formed over the top surface of the gate material, before or after patterning the features 250a and 250b, so that the top surface of the gate material is not implanted with the dopant species (not shown in the drawings) during the novel implantation processes 222, 224, 226, and 228.

Advantageously, the implantation processes 222, 224, 226, and 228 may be adjusted, modified, and tuned to achieve the electrical characteristics and device performance desired for the transistors 230a and 230b or other electronic components of a semiconductor device, for example. One or more parameters of the implantation processes 222, 224, 226, and 228 may be altered to achieve the particular implantation processes 222, 224, 226, and 228 desired, for example. Parameters that may be altered to achieve the desired dopant species concentration and depth include the angle of implantation, dose, energy level, and type of dopant species, as examples, although alternatively, other parameters of the implantation processes 222, 224, 226, and 228 may also be altered.

Figure 8:
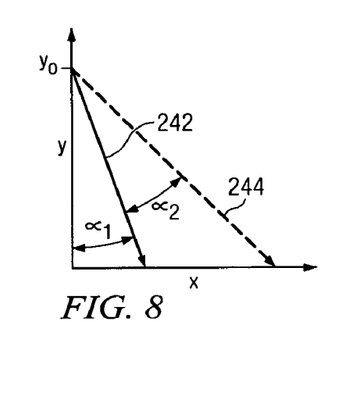
FIG. 8 illustrates a range of angles of implantation processes in accordance with a preferred embodiment of the present invention.

For example, the first implantation process 222 may comprise implanting the dopant species at a first angle with respect to a top surface of the workpiece 201, and the second implantation process 224 may comprise implanting the dopant species at a second angle with respect to the top surface of the workpiece 201, wherein the second angle is different than the first angle. FIG. 8 illustrates a range of angles $\alpha_1$, to $\alpha_2$, e.g., at directions 242 and 244, respectively, of the implantation processes 222, 224, 226, and 228 in accordance with a preferred embodiment of the present invention. The angles of implantation $\alpha_1$, to $\alpha_2$ of the implantation processes 222, 224, 226, and 228 preferably range from about 20 degrees to about 45 degrees from a direction ($y_0$) perpendicular to the planar surface (x) of the workpiece 201, as examples, although alternatively, other angles of implantation may also be used.

In another embodiment, the first implantation process 222 comprises implanting the dopant species using a first dose, and the second implantation process 224 comprises implanting the dopant species using a second dose, and wherein the second dose is different than the first dose.

In yet another embodiment, the first implantation process 222 comprises implanting the dopant species at a first energy level, and the second implantation process 224 comprises implanting the dopant species at a second energy level, wherein the second energy level is different than the first energy level.

In another embodiment, the first implantation process 222 comprises implanting the semiconductor device with a first dopant species, and the second implantation process 224 comprises implanting the semiconductor device with a second dopant species, the second dopant species being different than the first dopant species. The dopant species may comprise As, B, P, or other impurities that may alter the conductivity, insulative properties, or other properties of a semiconductor and/or conductive material, as examples, although other dopant species and combinations of dopant species may also be used.

In the embodiment shown in FIGS. 3 through 7, preferably a dopant species and other parameters of the implantation processes 222, 224, 226, and 228 are selected to achieve a desired compensation for the lengthening (or shortening, not shown) of the features 250a and 250b in the horizontal direction, in one embodiment. The parameters of the implantation processes 222, 224, 226, and 228 are preferably selected to affect the workpiece 201 and/or gate material sufficiently to compensate for the difference in the widths $x_{1L}$ and $y_2$ and/or lengths $y_1$ and $x_{2L}$ of the features 250a and 250b, respectively, so that devices 230a formed in region 206 comprise substantially the same electrical characteristics as electrical characteristics of devices 230b formed in region 208, for example.

Figure 9:
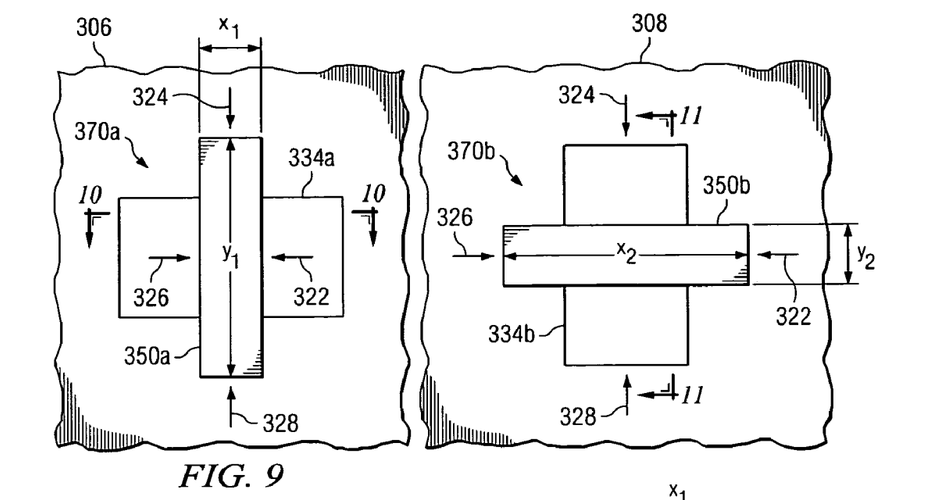
FIG. 9 shows a top view of a vertically oriented feature and a horizontally oriented feature in accordance with an embodiment of the present invention, wherein the vertically oriented feature and the horizontally oriented feature comprise substantially the same length and width.
Figure 10:
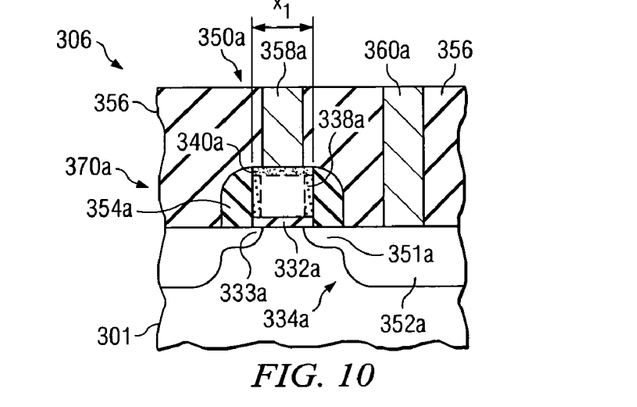
FIG. 10 shows a cross-sectional view of the vertically oriented feature of FIG. 9.
Figure 11:
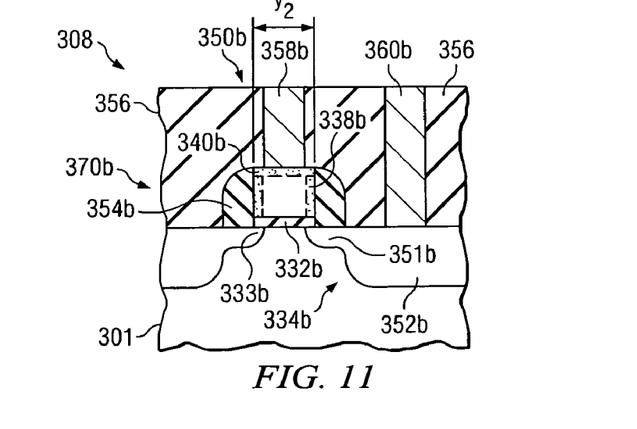
FIG. 11 shows a cross-sectional view of the horizontally oriented feature of FIG. 9.

However, in another embodiment, the features comprise substantially the same dimensions, and the dopant species and other parameters of the implantation processes 222, 224, 226, and 228 are selected to achieve a desired difference in the functioning and performance of devices formed in region 206 and 208, such as voltages or currents, to be described further herein with respect to the embodiment shown in FIGS. 9, 10, and 11.

In some embodiments, the third implantation 226 process preferably comprises the same set of parameters used for the first implantation process 222, and the fourth implantation 228 process preferably comprises the same set of parameters used for the second implantation process 224, for example. This may be advantageous in many applications, because the features 250a and 250b are implanted with a symmetric level of dopant species on opposing sidewalls. However, in other embodiments, each of the four implantation processes 222, 224, 226, and 228 may comprise different parameters than the other three implantation processes 222, 224, 226, and 228.

In some embodiments, more than four implantation processes 222, 224, 226, and 228 may be utilized, for example, not shown in the drawings. Five or more numbers of implantation processes 222, 224, 226, and 228 may be used, for example, to provide altered dopant concentrations in directions other than horizontally and vertically on features of the workpiece 201.

The novel implantation processes of embodiments of the present invention with varying parameters for different orientations or planar directions of a workpiece may also be implemented in semiconductor devices wherein the features comprise the same dimensions, as shown in FIGS. 9, 10, and 11. Like numerals are used for the various elements that were described in the previous figures, and to avoid repetition, each reference number shown in FIGS. 9, 10, and 11 is not described again in detail herein.

FIG. 9 shows a top view of a vertically oriented feature 350a and a horizontally oriented feature 350b in accordance with an embodiment of the present invention, wherein the vertically oriented feature 350a in region 306 and the horizontally oriented feature 350b in region 308 comprise substantially the same lengths $y_1$ and $x_2$ and widths $x_1$ and $y_2$, respectively. For example, length $y_1$ of feature 350a is substantially equal to length $x_2$ of feature 350b, and width $x_1$ of feature 350a is substantially equal to width $y_2$ of feature 350b. Horizontal implantation processes 322 and 326 and vertical implantation processes 324 and 328 are used to implant a dopant species at varying concentrations into the workpiece 301 (see FIGS. 10 and 11) and/or the features 350a and 350b, as described for the previous embodiments.

The devices 370a formed in region 306 having the vertically-oriented features 350a preferably comprise a first electrical characteristic, and the devices 370b formed in region 308 having the horizontally-oriented features 350b preferably comprise a second electrical characteristic, wherein the second electrical characteristic is different than the first electrical characteristic, due to the implantation processes 322, 324, 326, and 328 having one or more different parameters, for example.

FIG. 10 shows a cross-sectional view of the vertically oriented feature of FIG. 9, and FIG. 11 shows a cross-sectional view of the horizontally oriented feature of FIG. 9. Note that in this embodiment, implantation processes 322, 324, 326, and 328 may be used to form shallow implantation regions proximate the features 350a and 350b after the patterning of the gate material and the gate dielectric 332a and 332b of features 350a and 350b, e.g., at 351a and 351b. After a sidewall spacer 354a and 354b is formed over the sidewalls of the features 350a and 350b, respectively, another set of implantation processes 322, 324, 326, and 328 (e.g., the additional set of implantation processes may comprise different parameters than the implantation processes used to form the shallow implantation regions) may be used to form deep implantation regions proximate the sidewall spacers 354a and 354b, e.g., at 352a and 352b. The source and drain regions 334a and 334b comprise the shallow implantation regions 351a and 351b and deep implantation regions 352a and 352b, for example, respectively, in this embodiment. The embodiment of the present invention shown in FIGS. 3 through 7 may also include both shallow and deep implantation regions in the source and drain regions, not shown.

Again, in the embodiment shown in FIGS. 10 and 11, the amount that the shallow implantation region 351a and 351b extends beneath the features 350a and 350b may be the same or different for devices 370a and 370b formed in region 306 and 308, respectively, as a result of the novel implantation processes 322, 324, 326, and 328 described herein.

Some of the additional material layers formed after the semiconductor devices are completed are shown in the cross-sectional views of FIGS. 10 and 11. For example, an insulating material 356 comprising silicon oxide, silicon nitride, other insulators, or combinations thereof, may be formed over the completed transistor devices 370a and 370b, and contacts 358a/358b and 360a/360b are formed in the insulating material 356 to make electrical contact to the gates (e.g., the top surface of features 350a/350b) and source/drain regions 334a/334b, respectively.

Advantageously, the embodiment shown in FIGS. 10 and 11 results in the formation of a semiconductor device wherein features have the same size, but the electrical characteristics of the devices are different. Thus, two or more types of devices may be formed on a single integrated circuit without requiring the use of an additional lithography mask, in accordance with an embodiment of the present invention.

Embodiments of the present invention provide novel methods of solving the common problem of gate line width variations, by maintaining the device layout in the x and y directions and compensating for the gate line variations using implantation processes. The novel implantation processes 222, 224, 226, 228, 322, 324, 326, and 328 described herein comprise novel quad-mode implants that are used to define device extension and halo regions in some embodiments. For example, in some embodiments, using different conditions for the implantation processes in the x directions versus two y directions results in changing the effective current $I_{eff}$ of the devices in the x direction versus the y direction.

The first embodiment shown in FIGS. 3 through 7 may be used as a process control measure, for example, when the incoming x-y offset of devices is known. A control loop may be used with a look-up table, empirical model, or other means of storing and retrieving the x-y offset value of semiconductor devices, for example. The implant conditions in the x and y directions during the implantation processes may be defined differently to reduce the incoming variation effect on the effective current $I_{eff}$, for example. This may be accomplished by first, determining the systematic offset between the x and y direction on a particular wafer. The main contribution to the offset may be the lithography mask and lithography processes, although some etch process contribution may influence the offset, as examples.

The amount of offset may either be predicted by measuring the delta of x-y on the mask and adding the x-y lithography tool specific offset, which may be systematic, for example. This leads to a result for an x-y delta having a value of A. Alternatively the x-y delta, A, may be determined after a gate etch process using an inline critical dimension (CD) metrology and statistical analysis with x-y CD bars, for example. By choosing different conditions for the x and y implantation process components, the effect of the offset x-y delta, A, on the effective current $I_{eff}$ may be corrected on the incoming wafer by using a look-up table, empirical model, or other means of defining the implantation process conditions, for example.

This approach may be used as process control measure when the systematic (mean) incoming x-y offset of the devices is known and via a control loop with a look up table or empirical model the implant conditions in x and y during the extension/halo quad-mode implantation processes 222, 224, 226, 228, which are defined differently to reduce the incoming variation effect on $I_{eff}$ of devices in an x versus a y direction.

In the embodiment shown in FIGS. 9 through 11, different types of CMOS devices or other devices may be defined on a single chip or die without requiring the use of an additional lithography mask, decreasing the mask count required in CMOS technology, for example. In order to reduce the mask count, different devices may be laid out or positioned in different orientations, e.g., orthogonal to one another, and different implant conditions may be used in the x and y direction for defining extension and halo regions, which define the device behavior, for example.

As an example, a first device may be laid out in the x direction, and a second device may be laid out in the y direction. The first and second device may be exposed to the same process conditions (e.g., the same mask and mask generation/booleans) except for the extension/halo implant, in which the novel implantation processes 322, 324, 326, and 328 are used, producing different devices. For example, more halo dose in an x direction increases the device threshold in the first device to a much larger extent than the second device. The second device experiences less of an affect of the increased halo dose implant since it is along the device perimeter, and thus, the increased halo dose implant is not as effective in raising the threshold voltage $V_{th}$ of the second device. Thus, the implantation processes 322, 324, 326, and 328 may be used to define the device behavior.

Features of semiconductor devices manufactured using the novel methods described herein may comprise transistor gates, conductive lines, vias, capacitor plates, and other features, as examples. Embodiments of the present invention may be used to pattern features of memory devices, logic circuitry, and/or power circuitry, as examples, although other types of ICs may also be fabricated using the manufacturing techniques and implantation processes described herein.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor chip, the method comprising:
   providing a workpiece having a first semiconductor device and a second semiconductor device arranged thereon;
   implanting the semiconductor chip with a dopant species using a first implantation process in a first orientation of the workpiece, wherein the first implantation process comprises implanting the dopant species at a first angle with respect to a top surface of the workpiece; and
   implanting the semiconductor chip with the dopant species using a second implantation process in at least one second orientation of the workpiece, wherein the second implantation process comprises implanting the dopant species at a second angle with respect to the top surface of the workpiece, wherein the second angle is different than the first angle, and wherein the first semiconductor device comprises different operating parameters than the second semiconductor device.

2. The method according to claim 1, wherein the first orientation comprises a length of the first and second semiconductor devices, wherein the second orientation comprises a width of the first and second semiconductor devices.

3. The method according to claim 1, wherein the different implantation processes cause the different operating parameters.

4. The method according to claim 1, wherein the first semiconductor device comprises a plurality of first semiconductor devices and wherein the second semiconductor device comprises a plurality of second semiconductor devices.

5. The method according to claim 1, further comprising implanting the semiconductor chip with the dopant species using a third implantation process in the first orientation of the workpiece, wherein the third implantation process comprises implanting the dopant species at a third angle with respect to the top surface of the workpiece, wherein the third angle is different than the first angle.

6. The method according to claim 1, wherein the first semiconductor device comprises a first transistor and wherein the second semiconductor device comprises a second transistor.

7. A method fabricating a semiconductor chip, the method comprising:
   providing a workpiece, the workpiece having a first orientation and a second orientation, the workpiece having a first semiconductor device and a second semiconductor device arranged thereon;
   implanting the semiconductor chip with a dopant species using a first implantation process in the first orientation of the workpiece; and
   implanting the semiconductor chip with the dopant species using a second implantation process in the at least one second orientation of the workpiece, wherein the first implantation process comprises implanting the dopant species using a first dose, wherein the second implantation process comprises implanting the dopant species using a second dose, wherein the second dose is different than the first dose, and wherein the first semiconductor device comprises different operating parameters than the second semiconductor device.

8. The method according to claim 7, wherein the first orientation comprises a length of the first and second semiconductor devices and wherein the second orientation comprises a width of the first and second semiconductor devices.

9. The method according to claim 7, wherein the different implantation processes cause the different operating parameters.

10. The method according to claim 7, wherein the first semiconductor device comprises a plurality of first semiconductor devices and wherein the second semiconductor device comprises a plurality of second semiconductor devices.

11. The method according to claim 7, further comprising implanting the semiconductor chip with the dopant species using a third implantation process in the first orientation of the workpiece, wherein the third implantation process comprises implanting the dopant species using a third dose, wherein the third dose is different than the first dose.

12. The method according to claim 7, wherein the first semiconductor device comprises a first transistor and wherein the second semiconductor device comprises a second transistor.

13. A method of fabricating a semiconductor chip, the method comprising:
   providing a workpiece, the workpiece having a first orientation and a second orientation, the workpiece having a first semiconductor device and a second semiconductor device arranged thereon;
   implanting the semiconductor chip with a dopant species using a first implantation process in the first orientation of the workpiece; and
   implanting the semiconductor chip with the dopant species using a second implantation process in the at least one second orientation of the workpiece, wherein the first implantation process comprises implanting the dopant species at a first energy level, wherein the second implantation process comprises implanting the dopant species at a second energy level, wherein the second energy level is different than the first energy level, and wherein the first semiconductor device comprises different operating parameters than the second semiconductor device.

14. The method according to claim 13, wherein the first orientation comprises a length of the first and second semiconductor devices and wherein the second orientation comprises a width of the first and second semiconductor devices.

15. The method according to claim 13, wherein the different implantation processes cause the different operating parameters.

16. The method according to claim 13, wherein the first semiconductor device comprises a plurality of first semiconductor devices and wherein the second semiconductor device comprises a plurality of second semiconductor devices.

17. The method according to claim 13, further comprising implanting the semiconductor chip with the dopant species using a third implantation process in the first orientation of the workpiece, wherein the third implantation process comprises implanting the dopant species at a third energy level, wherein the third energy level is different than the first energy level.

18. The method according to claim 13, wherein the first semiconductor device comprises a first transistor and wherein the second semiconductor device comprises a second transistor.

19. A method of fabricating a semiconductor chip, the method comprising:
provided a workpiece, the workpiece having a first orientation and a second orientation, the workpiece having a first semiconductor device and a second semiconductor device arranged thereon;
implanting the semiconductor chip with a first dopant species using a first implantation process in the first orientation of the workpiece; and
implanting the semiconductor chip with a second dopant species using a second implantation process in the at least one second orientation of the workpiece, the second dopant species being different than the first dopant species, wherein the first semiconductor device comprises different operating parameters than the second semiconductor device.

20. The method according to claim 19, wherein the first orientation comprises a length of the first and second semiconductor devices and wherein the second orientation comprises a width of the first and second semiconductor devices.

21. The method according to claim 19, wherein the different implantation processes cause the different operating parameters.

22. The method according to claim 19, wherein the first semiconductor device comprises a plurality of first semiconductor devices and wherein the second semiconductor device comprises a plurality of second semiconductor devices.

23. The method according to claim 19, further comprising implanting the semiconductor chip with a third dopant species using a third implantation process in the first orientation of the workpiece, the third dopant species being different than the first and the second dopant species.

24. The method according to claim 19, wherein the first semiconductor device comprises a first transistor and wherein the second semiconductor device comprises a second transistor.

25. A method of fabricating a semiconductor device, the method comprising:
forming a first feature and a second feature in or on a workpiece, the first and the second features all having substantially the same width and substantially the same length;
implanting the semiconductor device with a dopant species using a first implantation process in a first direction of the workpiece; and
implanting the semiconductor device with the dopant species using a second implantation process in a second direction of the workpiece, wherein the second implantation process comprises a plurality of second parameters, wherein the first implantation process comprises a plurality of first parameters, wherein the plurality of first parameters is different than the plurality of second parameters and wherein the first feature comprises different operating parameters than the second feature.

26. The method according to claim 25, wherein before implanting the semiconductor device with the dopant species using the first implantation process, the workpiece is oriented in a first position, wherein after implanting the semiconductor device with the dopant species using the first implantation process, the workpiece is rotated about 90 degrees to a second position, and then the semiconductor device is implanted with the dopant species using the second implantation process.

27. The method according to claim 26, further comprising rotating the workpiece about 90 degrees to a third position, after implanting the semiconductor device with the dopant species using the second implantation process, and then, implanting the semiconductor device with the dopant species using a third implantation process.

28. The method according to claim 25, wherein the first feature comprises a first transistor and wherein the second feature comprises a second transistor.

29. A method of fabricating a semiconductor device, the method comprising:
forming a first feature and a second feature in or on a workpiece, the first and the second features all having substantially a same width and substantially a same length;
implanting the semiconductor device with a dopant species using a first implantation process in a first position of the workpiece;
rotating the workpiece about 90 degrees to a second position after implanting the semiconductor device with the dopant species using the first implantation process;
implanting the semiconductor device with the dopant species using a second implantation process in the second position of the workpiece, wherein the second implantation process comprises a plurality of second parameters, wherein the first implantation process comprises a plurality of first parameters, and wherein the plurality of first parameters is different than the plurality of second parameters;
rotating the workpiece about 90 degrees to a third position, after implanting the semiconductor device with the dopant species using the second implantation process; and
implanting the semiconductor device with the dopant species using a third implantation process, wherein the third implantation process comprises the same plurality of first parameters as the first implantation process.

30. The method according to claim 29, further comprising rotating the workpiece about 90 degrees to a fourth position, after implanting the semiconductor device with the dopant species using the third implantation process, and then, implanting the semiconductor device with the dopant species using a fourth implantation process.

31. The method according to claim 30, wherein the fourth implantation process comprises the same plurality of second parameters as the second implantation process.

* * * * *